United States Patent
Raberg

(10) Patent No.: US 10,403,813 B2
(45) Date of Patent: Sep. 3, 2019

(54) METHOD FOR FORMING A MAGNETORESISTIVE DEVICE

(71) Applicant: Infineon Technologies AG, Neubiberg (DE)

(72) Inventor: Wolfgang Raberg, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 4 days.

(21) Appl. No.: 15/488,144

(22) Filed: Apr. 14, 2017

(65) Prior Publication Data

US 2017/0222137 A1    Aug. 3, 2017

Related U.S. Application Data

(62) Division of application No. 13/419,564, filed on Mar. 14, 2012, now abandoned.

(51) Int. Cl.
| | |
|---|---|
| G11B 5/127 | (2006.01) |
| H04R 31/00 | (2006.01) |
| H01L 43/12 | (2006.01) |
| G01R 33/09 | (2006.01) |
| G01R 33/00 | (2006.01) |
| H01L 43/02 | (2006.01) |
| H01L 43/08 | (2006.01) |

(52) U.S. Cl.
CPC .......... *H01L 43/12* (2013.01); *G01R 33/0052* (2013.01); *G01R 33/09* (2013.01); *G01R 33/095* (2013.01); *H01L 43/02* (2013.01); *H01L 43/08* (2013.01)

(58) Field of Classification Search
CPC .. G01R 33/09; G01R 33/0052; G01R 33/095; H01L 43/12; H01L 43/02; H01L 43/08
See application file for complete search history.

(56) References Cited

U.S. PATENT DOCUMENTS

| | | | |
|---|---|---|---|
| 7,005,958 B2 | 2/2006 | Wan | |
| 7,038,894 B2* | 5/2006 | Inomata | B82Y 10/00 257/E21.665 |
| 7,973,351 B2* | 7/2011 | Marukame | H01F 10/1936 257/295 |
| 9,230,623 B2* | 1/2016 | Kim | G11C 11/161 |
| 9,423,474 B2* | 8/2016 | Paci | G01R 33/0017 |
| 9,653,135 B2* | 5/2017 | Bernard-Granger | G11C 8/16 |
| 2002/0186011 A1 | 12/2002 | Murata et al. | |
| 2005/0179429 A1 | 8/2005 | Lohberg | |
| 2005/0258820 A1 | 11/2005 | Forster | |
| 2009/0001965 A1 | 1/2009 | Ausserlechner et al. | |
| 2009/0015252 A1 | 1/2009 | Raberg et al. | |
| 2009/0279212 A1 | 11/2009 | Engel et al. | |
| 2010/0141251 A1 | 6/2010 | Ando et al. | |
| 2011/0025320 A1 | 2/2011 | Ohta et al. | |

* cited by examiner

*Primary Examiner* — Paul D Kim
(74) *Attorney, Agent, or Firm* — Schiff Hardin LLP

(57) ABSTRACT

Embodiments relate to magnetoresistive (xMR) sensors. In an embodiment, an xMR stack structure is configured to form two different xMR elements that can be coupled to form a locally differential Wheatstone bridge. The result is a highly sensitive magnetic sensor with small dimensions and robustness against thermal drift and sensor/encoder pitch mismatch that can be produced using standard processing equipment. Embodiments also relate to methods of forming and patterning the stack structure and sensors that provide information regarding direction in addition to speed.

17 Claims, 4 Drawing Sheets

METHOD FOR FORMING A MAGNETORESISTIVE DEVICE

CROSS REFERENCE TO RELATED APPLICATIONS

This patent application is a divisional application of U.S. patent application Ser. No. 13/419,564, filed Mar. 14, 2012, now abandoned, entitled "XMR MONOCELL SENSORS, SYSTEMS AND METHODS," which is incorporated herein by reference in its entirety.

TECHNICAL FIELD

The invention relates generally to magnetoresistive (xMR) sensors and more particularly to speed xMR sensors.

BACKGROUND

In some speed sensing applications, it is important to carefully control the position of the wheelshaft regardless of the rotation speed of the wheelshaft. Some conventional approaches use magnetic sensors based on the Hall effect to detect the magnetic field generated by a magnetic encoder wheel mounted on the shaft to be controlled. Others use sensors based on magnetoresistive effects, including the giant magnetoresistive effect (GMR), anisotropic magnetoresistive effect (AMR) or the tunneling magnetoresistive effect (TMR).

In magnetoresistive systems, a differential Wheatstone bridge-like approach typically is used to avoid issues related to thermal drift. In AMR systems, this can be done by tilting the current flow +/−45 degrees with respect to the encoder field axis. In typical spinvalve-like GMR or TMR systems, this can be achieved either by locally different magnetization, which is quite difficult to be realized and can require compromises in signal amplitude, or by spatial separation of the resistive elements. The latter works well if the spacing between the two halves of the bridge corresponds to half of the polewheel pitch. Any deviation from this pitch match will lead to a degradation of the differential signal amplitude and an increase in signal jitter, among other potential negative effects. Another general weakness of conventional monocell approaches is a lack of information regarding the direction of rotation of the encoder wheel.

Therefore, there is a need for improved xMR sensors.

SUMMARY

Embodiments relate to xMR sensors, such as for speed sensing. Embodiments also can provide direction sensing.

In an embodiment, a magnetic field sensor comprises a first magnetoresistive (xMR) sensor element configured to have a first response to a magnetic field; and a second xMR sensor element configured to have a second response to the magnetic field different from the first response, wherein the first and second xMR sensor elements having the same reference magnetization direction.

In an embodiment, a magnetic field sensor comprises a first sensor element arrangement configured to sense a magnetic field at a first location; and at least one additional xMR sensor element configured to provide direction information related to the magnetic field and spaced apart from the first sensor element arrangement.

In an embodiment, a method comprises forming first and second magnetoresistive stacks by forming a reference system and a free-layer system for each of the first and second magnetoresistive stacks such that the free-layer system of the first magnetoresistive stack includes first and second free-layers, and the free-layer system of the second magnetoresitive stack includes only one of the first or second free-layers.

BRIEF DESCRIPTION OF THE DRAWINGS

The invention may be more completely understood in consideration of the following detailed description of various embodiments of the invention in connection with the accompanying drawings, in which.

Figure 1:
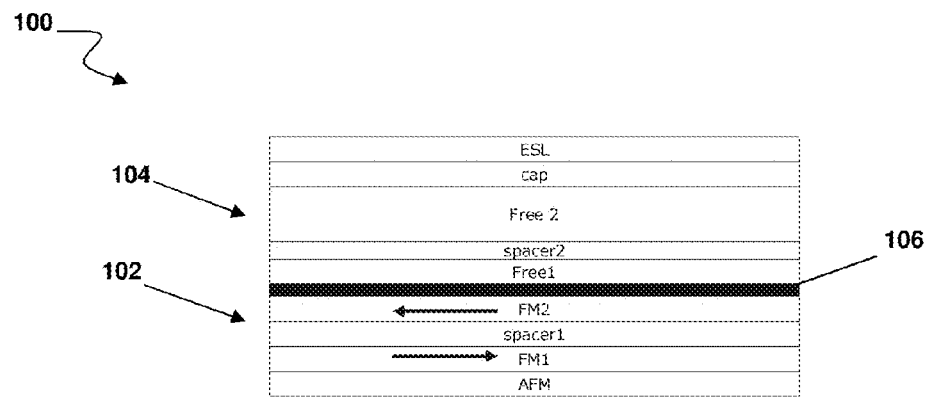
FIG. 1 is a side cross-sectional view of a magnetoresistive (xMR) stack according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to magnetoresistive (xMR) sensors. In an embodiment, an xMR stack structure is configured to form at least two different xMR elements that can be coupled to form a locally differential Wheatstone bridge. The at least two different xMR elements can be structurally different but have the same reference magnetization direction. In embodiments, the at least two different xMR elements can have similarly or identically structured reference systems, where the reference system is a system which provides a permanent reference magnetization for spin valve systems. Typically, at least one layer of the reference system is magnetized during manufacturing by an external magnetic field to provide the reference magnetic field. In embodiments, the reference systems of the at least two different xMR elements have the same layer or similar layer sequences. In embodiments, the same layer sequence can include the same layer thicknesses for some or all of the layers. In embodiments, the layer sequences of the reference systems are deposited in the same deposition step during manufacturing.

In embodiments, structural differences between the at least two elements can include differently structured free-layer systems. The free-layer system of one xMR element can have at least one additional layer in the free-layer stack compared with another xMR element. In embodiments, the at least one additional layer of the free-layer system can include at least one layer which is anti-ferromagnetic coupled to another layer of the free-layer system. In embodiments, the at least two different xMR elements can have a free-layer stack that includes at least one common layer in the stack of the free-layer system in each of the at least two xMR elements and at least one additional layer in one of the at least two xMR elements which is anti-ferromagnetic coupled to the common layer. The at least one common layer can be deposited in a common deposition step during manufacturing. In embodiments, the free-layer system of a first one of the at least two xMR elements is formed by a stack including a plurality of free-layers, and the free-layer system of another xMR element is formed by the same stack with at least one of the plurality of free-layers being removed or missing. The result is a highly sensitive magnetic sensor with small dimensions and robustness against thermal drift and sensor/encoder pitch mismatch that can be produced using standard processing equipment. Embodiments also relate to methods of forming and patterning the stack structure and sensors that provide information regarding direction in addition to speed.

Referring to FIG. 1, a basic starting structure for embodiments is a GMR or TMR stack 100. Stack 100 comprises a ferromagnetic reference system 102, ferromagnetic free-layer system 104 and a non-magnetic spacer layer 106 between the free and reference layer systems 104 and 102.

Freelayer system 104 comprises two ferromagnetic layers, Free1 and Free2, separated by a non-magnetic spacer layer, spacer2, that provides a very strong antiferromagnetic coupling between the two ferromagnetic layers. The thicknesses of Free1 and Free2 are selected in embodiments such that the freelayer located further away from reference system 102 is thicker than the other freelayer, and a difference in the magnetic moments of the two layers roughly corresponds to the moment of the moment of the thinner layer. In operation, Free2 matches the external magnetic field while Free1 is the opposite of Free2.

A cap layer, cap, and etch stop layer, ESL, are deposited on the Free2. In embodiments, cap comprises TaN or some other suitable material, while ESL can comprise the same material as spacer layer 106, such as Ru or some other suitable material.

Figure 2:
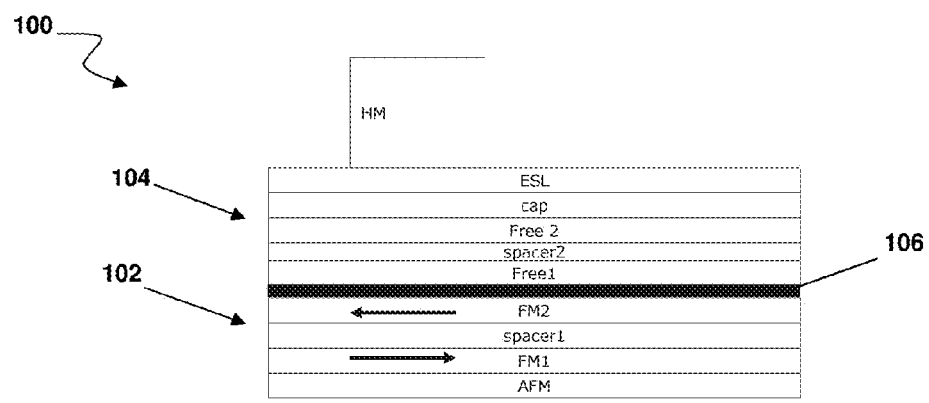
FIG. 2 is a side cross-sectional view of a xMR stack according to an embodiment.

A hardmask, HM, is then deposited on ESL, patterned and etched. In an embodiment, HM is patterned using a resist mask and etched using a dry etch process which selectively stops on ESL such that the cross-section of stack 100 as depicted in FIG. 2 is obtained.

Figure 3:
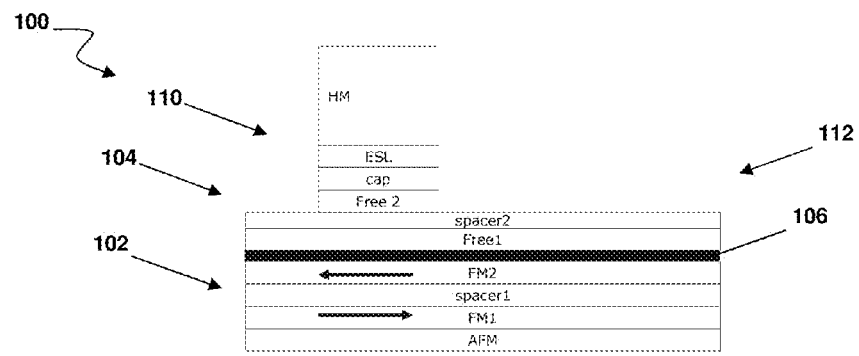
FIG. 3 is a side cross-sectional view of a xMR stack according to an embodiment.

Next, ESL is selectively removed from cap, such as by oxygen plasma if Ru is used or in some other suitable manner. Cap and Free2 are selectively etched, stopping at spacer2. The result, depicted in FIG. 3, comprises a first portion 110 below the hardmask where the complete stack remains and a second portion 112 where Free2 has been removed.

Figure 4:
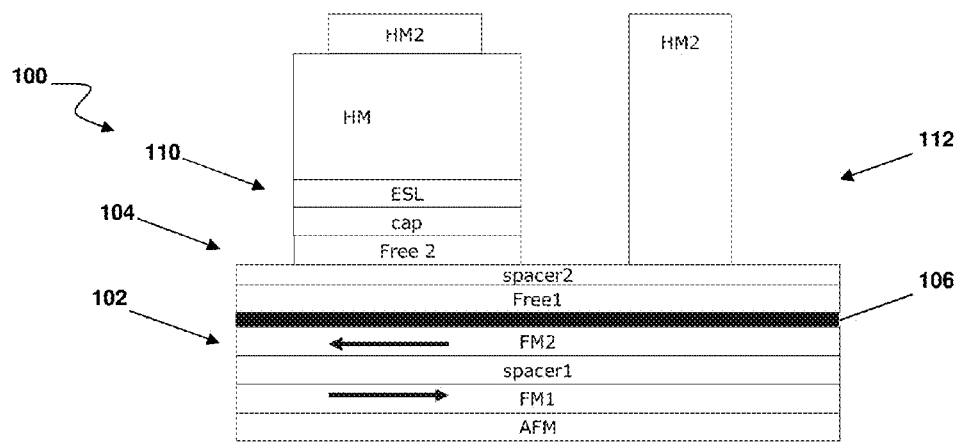
FIG. 4 is a side cross-sectional view of a xMR stack according to an embodiment.

Then, a second hardmask layer, HM2, is deposited and patterned using a resist mask such that the patterns are formed in the first portion 110 and second portion 112 simultaneously. The resulting stack is depicted in FIG. 4.

Figure 5:
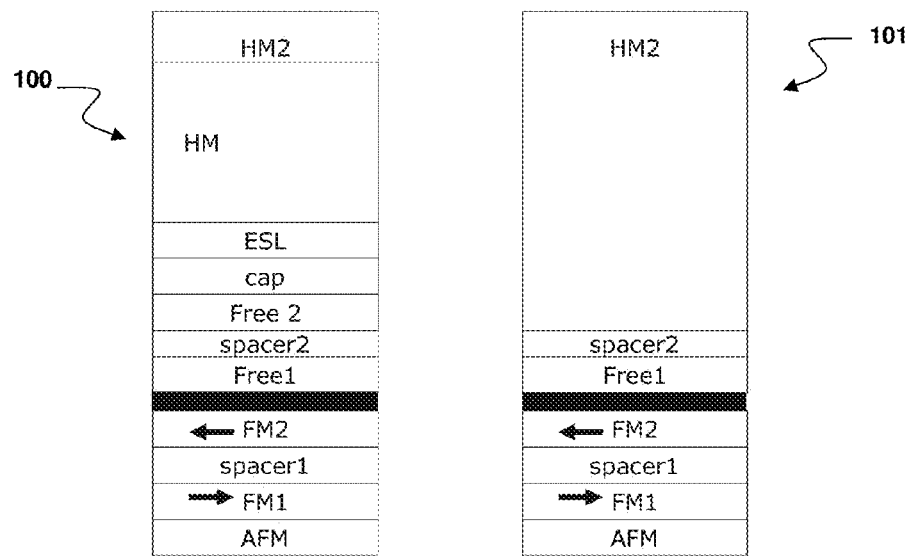
FIG. 5 is a side cross-sectional view of two xMR elements according to an embodiment.

Stack 100 is then patterned using HM2 such that different types of stack elements, or monocells, are formed. A monocell is a sensor element arrangement that determines the magnetic field substantially only at a single location while, for example, other cells, such as differential cells, determine magnetic fields at two or more locations. FIG. 5 depicts stack element 100 and stack element 101. Stack elements 100 and 101 have the same reference layer direction and signal generating layer system (FM2, spacer layer 106, Free1) but have responses with opposing signs to external magnetic fields because of the inverted magnetic moments of Free1. In other words, a structure is provided which can have two different responses to the same magnetic field. The structure, however, provides the same reference system for both stack elements. In embodiments, the reference system is magnetized such that both stack elements have a reference magnetization in the same direction. This simplifies the reduces the cost of magnetization during manufacturing as the external magnetic field to be applied to generate the reference magnetization can be applied for all stack elements in only one direction. Furthermore, the elements can be formed much closer to each other because the reference magnetization is magnetized in the same direction, compared with conventional approaches which utilize differ magnetizations and therefore have to provide a minimum separation distance in order to avoid disturbing the reference magnetization in different directions. Due to the additional Free2 layer in stack 100, which is anti-ferromagnetic, coupled to the Free1 layer, opposing behaviors are achieved for stack elements 100 and 101 even though both have the same reference magnetization. The opposing behaviors include, for example, electric resistance, but other physical parameters also can be different for stack elements 100 and 101. For example, sensor elements having the stack configurations of stack elements 100 and 101 have both an electrical resistance being dependent on the angle between an in-plane magnetic field to be measured and the reference magnetization. The behavior of stack elements 100 and 101, however, is the opposite, i.e, the sensor element based on stack element 101 has its lowest resistance when the magnetic field to be measured and the reference magnetization are parallel, while the sensor element based on stack element 100 has its highest resistance. In embodiments, the resistance change for a sensor element based on stack element 100 is determined by $\Delta R = R_0 \cdot \cos(\phi)$, while the resistance change for a sensor element based on stack element 101 is determined by $\Delta R = -R_0 \cdot \cos(\phi)$, where $\phi$ is the angle between the in-plane field component of the magnetic field to be measured and the reference magnetization. It is to be noted, however, that other embodiments are conceivable, which provide for different behavior of other physical parameters of sensor elements based on stack elements 100 and 101.

Figure 6:
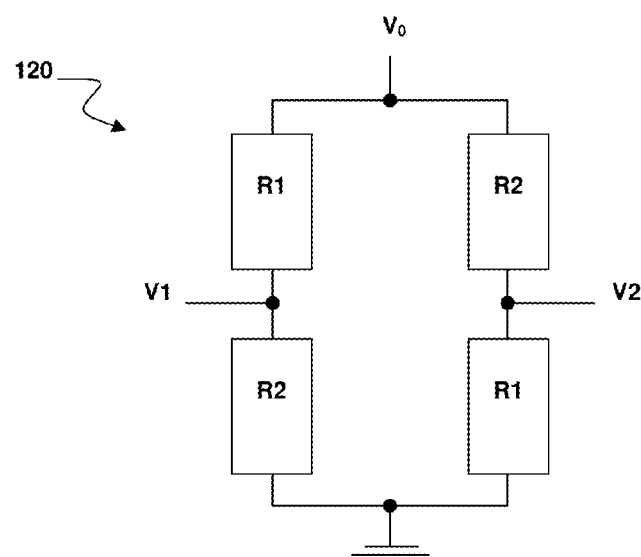
FIG. 6 is a diagram of a Wheatstone bridge of xMR elements according to an embodiment.

With these properties, a locally differential Wheatstone bridge 120 can be formed, as depicted in FIG. 6. In FIG. 6, R1 comprises stack element 100, while R2 comprises stack element 101. Accordingly:

$$V1 = V_0(R1/(R1+R2))$$

$$V2 = V_0(R2/(R1+R2))$$

In embodiments, R1 and R2 can comprise GMR or TMR elements and can be arranged in an area that is less than about 50 µm high and less than about 1 mm wide, such as less than about 100 µm wide in embodiments, or less than 10 µm wide in other embodiments.

Other embodiments are also contemplated, including using a top spinvalve stack instead of the bottom spinvalve stack discussed above, and forming Free2 by other techniques, such as a damascene approach. In one embodiment of a damascene approach, a trench can be formed in which Free2 layer is deposited while Free2 layer is not deposited or removed after deposition in portions outside the trench. Then, above Free2 layer Spacer 2 layer can be deposited in at least the region of the trench. Free1 layer is deposited in the region of the trench as well as in other regions to establish the at least two different xMR elements having different stack layers.

In many applications, it is also desired to know information about the direction of rotation. This can be accomplished in embodiments by providing an additional xMR element spaced apart from bridge 120. The signal of the additional xMR element will be phase shifted with respect to the signal of bridge 120, and the sign of the phase shift will depend on the direction of the rotation of the encoder wheel.

Figure 7:
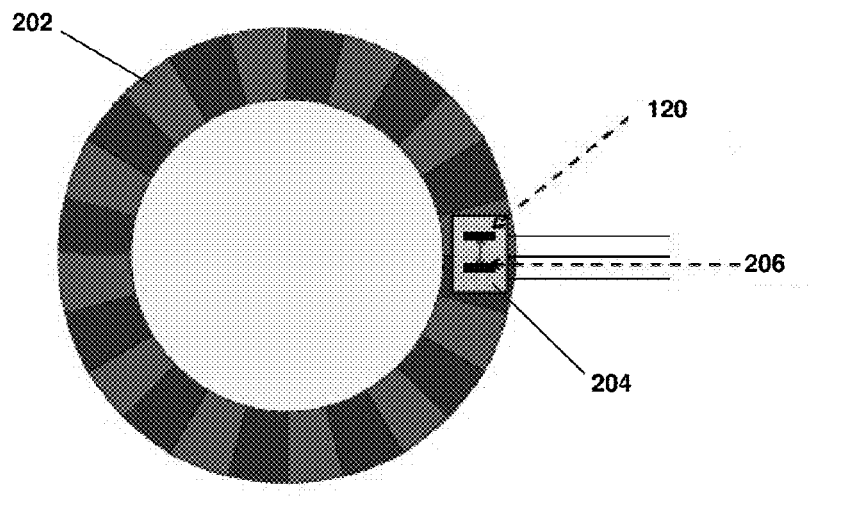
FIG. 7 is a diagram of a polewheel and sensor arrangement according to an embodiment.

Referring to FIG. 7, a polewheel 202 and sensor 204 are depicted. In other embodiments, a ferrous target wheel and back biasing magnet can be used. Sensor 204 comprises an xMR bridge 120, as depicted in FIG. 6 for example, and an additional xMR element serving as a "direction" xMR 206. Bridge 120 and element 206 are spaced apart from one another by a defined distance, such as about 500 µm in one embodiment.

Figure 8:
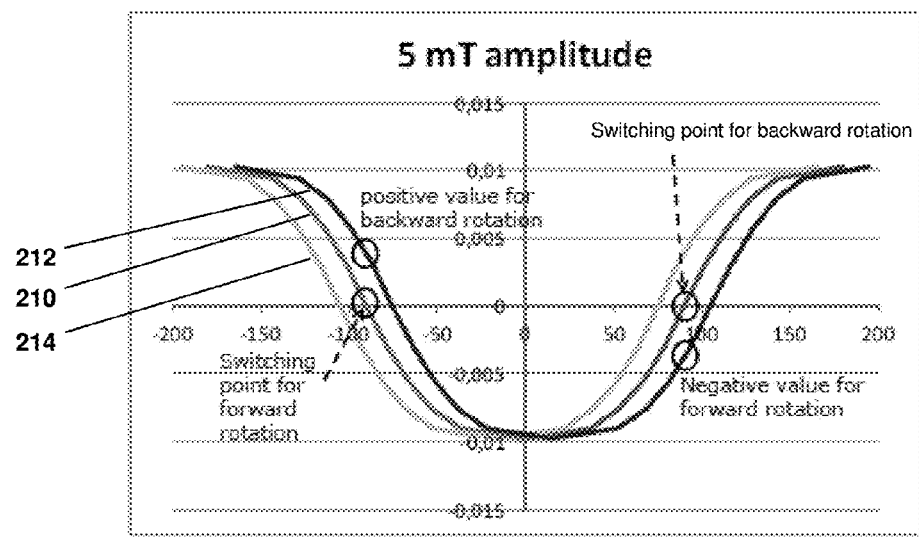
FIG. 8 is a plot of a output signal amplitudes according to an embodiment.

Referring also to FIG. 8, the bridge signal from the active cell along a polepair is shown at 210. The signals of two bridges phase-shifted by 15 degrees, delayed or advanced, are also shown at 212 and 214. A phase-shift of 15 degrees corresponds to spacing between bridge 120 and xMR element 206 of about 500 µm in front of polewheel 202 having a pitch of 12.3 mm. For wheels with some other pitch, the distance between bridge 120 and xMR element 206 can be chosen to achieve the same or some other phase shift angle.

Direction detection can be realized by evaluating the sign of signal 212 of xMR element 206 at the switching threshold. If, for example, the zero transition in the rising slope of signal 212 is used for generating the speed pulse, and direction xMR element 206 is arranged such that its signal lags by 15 degrees during forward rotation, then signal 212 will be negative at the switching point. In contrast, a backward rotation within the same configuration will lead to a positive signal 212 from direction xMR element 206.

A significant advantage of embodiments is that they can provide a wheel speed sensor with direction detection that has small chip dimensions even for applications using large target wheels. The spacing distance between bridge 120 and direction xMR element 206 is related to the pole length of the encoder wheel and the minimum phase shift detectable by sensor 204 but is in any event negligible with respect to the size of sensor 204. Moreover, direction xMR element 206 can be arranged anywhere on sensor 204 in embodiments, for example at an edge or another advantageous position with respect to bridge 120 such that the overall size of sensor 204 can be reduced to, e.g., several hundred micrometers in at least one direction, thereby reducing manufacturing costs. In embodiments, direction xMR element 206 can be the same as bridge 120 or comprise some other xMR sensor configuration. An additional advantage to including a second identical element in sensor 204 is that bridge 120 and direction xMR element 206 can be redundant, with one or the other available if a failure occurs. Self-monitoring within sensor 204 can also be provided. In yet other embodiments, a single additional element can be used to provide the direction signal, in which case an offset correction algorithm can be applied.

Embodiments can provide robust, locally concentrated xMR sensing elements that provide a large signal and low jitter while also being robust against offset drift and other drawbacks affecting conventional approaches. Embodiments can also provide information regarding a direction of rotation, in addition to speed of rotation. Various embodiments are suitable for many different sensor applications, including wheel speed sensors for crankshaft, camshaft, transmission, anti-lock braking system (ABS) and others.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art. Furthermore, although a specific dependent claim may refer to only one claim, independent or dependent, it may be understood that the present invention also encompasses combination of claim elements with other non-referenced claims. Furthermore, it is further intended to disclose embodiments which include claim elements provided in an independent claim or claim made dependent to an independent claim in a further independent claim or a dependent claim of a further independent claim. In addition, it is intended to disclose embodiments which include features of the detailed description in combination with one or more independent or dependent claims unless otherwise noted.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method for forming a magnetoresistive device including first and second magnetoresistive stack elements, the method comprising:
    forming a magnetoresistive stack system comprising a freelayer system and a reference system coupled by a spacer layer, the freelayer system comprising first and second freelayers;
    selectively etching the magnetoresistive stack system to remove the second freelayer from a second portion of the magnetoresistive stack system while maintaining the second freelayer in a first portion of the magnetoresistive stack system; and
    patterning the magnetoresistive stack system to form:
        the first magnetoresistive stack element from the first portion of the magnetoresistive stack system that includes a first portion of the reference system and a first portion of the freelayer system having the first and the second freelayers; and
        the second magnetoresistive stack element from the second portion of the magnetoresistive stack system that includes a second portion of the reference system and a second portion of the freelayer system having only the second freelayer of the first and second freelayers.

2. The method of claim 1, wherein forming the magnetoresistive stack system comprises:
depositing the first freelayer in the first and the second portions of the magnetoresistive stack system, and
depositing the second freelayer on the first freelayer in the first and the second portions of the magnetoresistive stack system.

3. The method of claim 1, wherein forming the first and the second magnetoresistive stack elements comprises depositing layers for the respective first and second portions of the reference system of the first and the second magnetoresistive stack elements in a common deposition step.

4. The method of claim 1, further comprising applying an external magnetic field to the reference system to impress a reference magnetization in a same direction for the first and the second portions of the reference system of the first and second magnetoresistive stack elements.

5. The method of claim 1,
wherein the patterning of the magnetoresistive stack system separates the selectively etched magnetoresistive stack system into the first magnetoresistive stack element and the second magnetoresistive stack element.

6. A method for forming a magnetoresistive device, comprising:
forming a magnetoresistive stack system; and
patterning the magnetoresistive stack system to separate the magnetoresistive stack system into a first magnetoresistive stack including a first reference system and a first freelayer system, and a second magnetoresistive stack including a second reference system and a second freelayer system, wherein patterning the magnetoresistive stack system comprises:
depositing a first hardmask on a first portion of the magnetoresistive stack system corresponding to the first magnetoresistive stack;
etching the first portion and a second portion of the magnetoresistive stack system to remove the second freelayer in the second portion of the magnetoresistive stack system, the second portion corresponding to the second magnetoresistive stack, wherein the first freelayer system of the first magnetoresistive stack includes first and second freelayers, and the second freelayer system of the second magnetoresistive stack includes only the second freelayer of the first and second freelayers;
depositing a second hardmask on the first hardmask on the first portion of the magnetoresistive stack system and on the second portion of the magnetoresistive stack system; and
etching the magnetoresistive stack system to separate the magnetoresistive stack system into the first magnetoresistive stack the second magnetoresistive stack.

7. The method of claim 6, wherein the etching of the first portion and the second portion of the magnetoresistive stack system selectively removes the second freelayer in the second portion of the magnetoresistive stack system corresponding to the second magnetoresistive stack while maintaining the second freelayer in the first portion of the magnetoresistive stack system.

8. The method of claim 6, wherein forming the magnetoresistive stack system comprises depositing the first and second reference systems of the first and the second magnetoresistive stacks in a common deposition step.

9. The method of claim 6, wherein:
the forming the magnetoresistive stack system comprises forming a freelayer system and a reference system coupled by a spacer layer, the freelayer system comprising the first and the second freelayers and the reference system comprising the first and the second reference systems.

10. The method of claim 6, wherein forming the magnetoresistive stack system comprises:
forming the first freelayer in the first and the second portions of the magnetoresistive stack system; and
forming the second freelayer on the first freelayer in the first and the second portions of the magnetoresistive stack system.

11. The method of claim 6, further comprising applying an external magnetic field to the reference system to impress a reference magnetization in a same direction for the first and the second reference systems of the first and second magnetoresistive stacks.

12. The method of claim 6, wherein depositing the second hardmask on the first hardmask on the first portion of the magnetoresistive stack system and on the second portion of the magnetoresistive stack system are performed in a common deposition step.

13. A method for forming a magnetoresistive device, comprising:
forming a magnetoresistive stack system including a freelayer system having a first freelayer and a second freelayer;
selectively etching the magnetoresistive stack system to remove the second freelayer in a second portion of the magnetoresistive stack system while maintaining the second freelayer in a first portion of the magnetoresistive stack system; and
etching the selectively etched magnetoresistive stack system to separate the magnetoresistive stack system into:
a first magnetoresistive stack corresponding to the first portion of the magnetoresistive stack system having the first and second freelayers, and
a second magnetoresistive stack corresponding to the second portion of the magnetoresistive stack system including only the first freelayer of the first and second freelayers.

14. The method of claim 13, wherein forming the magnetoresistive stack system comprises:
depositing the first freelayer in the first and the second portions of the magnetoresistive stack system, and
depositing the second freelayer on the first freelayer in the first and the second portions of the magnetoresistive stack system.

15. The method of claim 13, wherein the magnetoresistive stack system further comprises a reference system, the first and the second freelayers being disposed on the reference system, wherein the first magnetoresistive stack includes a first portion of the reference system and the second magnetoresistive stack includes a second portion of the reference system.

16. The method of claim 13, further comprising:
depositing a first hardmask on the first portion of the magnetoresistive stack system prior to the selectively etching of the magnetoresistive stack system; and
after the selective etching of the magnetoresistive stack system and prior to the etching of the selectively etched magnetoresistive stack system, depositing a second hardmask on the first hardmask on the first portion of the magnetoresistive stack system and on the second portion of the magnetoresistive stack system.

17. The method of claim 13, wherein the magnetoresistive stack system further comprises a spacer layer formed between the first and second freelayers.

\* \* \* \* \*